(12) United States Patent
Lee et al.

(10) Patent No.: US 7,040,525 B2
(45) Date of Patent: May 9, 2006

(54) STAGE STRUCTURE IN BONDING MACHINE AND METHOD FOR CONTROLLING THE SAME

(75) Inventors: Sang Seok Lee, Taegu-kwangyokshi (KR); Sang Ho Park, Pusan-kwangyokshi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 87 days.

(21) Appl. No.: 10/323,882

(22) Filed: Dec. 20, 2002

(65) Prior Publication Data

US 2003/0178468 A1    Sep. 25, 2003

(30) Foreign Application Priority Data

Mar. 20, 2002  (KR) ................. 2002-14998
Mar. 20, 2002  (KR) ................. 2002-15077

(51) Int. Cl.
*B23K 37/04* (2006.01)
(52) U.S. Cl. ............... 228/49.5; 228/44.7; 269/21
(58) Field of Classification Search ............. 228/44.3, 228/44.7, 49.1, 49.5, 102, 103, 212, 213; 269/21; 361/234; 349/187, 189, 190, 191
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,653,864 A | 3/1987 | Baron et al. | |
| 4,691,995 A | 9/1987 | Yamazaki et al. | |
| 4,775,225 A | 10/1988 | Tsuboyama et al. | |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,407,519 A * | 4/1995 | Joffe et al. | 156/358 |
| 5,499,128 A | 3/1996 | Hasegawa et al. | |
| 5,507,323 A | 4/1996 | Abe | |
| 5,511,591 A | 4/1996 | Abe | |
| 5,539,545 A | 7/1996 | Shimizu et al. | |
| 5,548,429 A | 8/1996 | Tsujita | |
| 5,572,398 A * | 11/1996 | Federlin et al. | 361/234 |
| 5,642,214 A | 6/1997 | Ishii et al. | |
| 5,677,824 A * | 10/1997 | Harashima et al. | 361/234 |
| 5,680,189 A | 10/1997 | Shimizu et al. | |
| 5,742,370 A | 4/1998 | Kim et al. | |
| 5,757,451 A | 5/1998 | Miyazaki et al. | |
| 5,852,484 A | 12/1998 | Inoue et al. | |
| 5,854,664 A | 12/1998 | Inoue et al. | |
| 5,861,932 A | 1/1999 | Inata et al. | |

(Continued)

FOREIGN PATENT DOCUMENTS

EP     1003066 A1    5/2000

(Continued)

*Primary Examiner*—Jonathan Johnson
(74) *Attorney, Agent, or Firm*—McKenna Long & Aldridge LLP (57) ABSTRACT

Stage structure in a bonding machine including a plate movably fitted in a bonding chamber, a plurality of blocks of electro-static chucks fitted to the plate for providing an electro-static force to hold a substrate, a plurality of vacuum holes in the plate around the electro-static chucks for receiving a vacuum force, and adsorbing and holding the substrate, and a plurality of alignment mark confirming holes in a periphery of the plate for confirming the marks for aligning the adsorbed substrate, thereby separating substrate from the stage more easily by applying a DC power with polarities opposite to a regular DC power.

22 Claims, 7 Drawing Sheets

U.S. PATENT DOCUMENTS

| | | |
|---|---|---|
| 5,875,922 A | 3/1999 | Chastine et al. |
| 5,914,568 A * | 6/1999 | Nonaka ................. 315/111.21 |
| 5,952,678 A | 9/1999 | Ashida |
| 5,956,112 A | 9/1999 | Fujimori et al. |
| 6,001,203 A | 12/1999 | Yamada et al. |
| 6,011,609 A | 1/2000 | Kato et al. |
| 6,016,178 A | 1/2000 | Kataoka et al. |
| 6,016,181 A | 1/2000 | Shimada |
| 6,055,035 A | 4/2000 | von Gutfeld et al. |
| 6,163,357 A | 12/2000 | Nakamura |
| 6,219,126 B1 | 4/2001 | Von Gutfeld |
| 6,226,067 B1 | 5/2001 | Nishiguchi et al. |
| 6,236,445 B1 | 5/2001 | Foschaar et al. |
| 6,304,306 B1 | 10/2001 | Shiomi et al. |
| 6,304,311 B1 * | 10/2001 | Egami et al. ................ 349/189 |
| 6,337,730 B1 | 1/2002 | Ozaki et al. |
| 6,414,733 B1 | 7/2002 | Ishikawa et al. |
| 6,556,414 B1 * | 4/2003 | Kosakai ...................... 361/234 |
| 6,665,043 B1 * | 12/2003 | Okuyama et al. ........... 349/187 |
| 6,848,961 B1 * | 2/2005 | Nomura et al. ............... 445/24 |
| 2001/0019472 A1 * | 9/2001 | Kanno et al. ................ 361/234 |
| 2001/0041490 A1 * | 11/2001 | Nomura et al. ................ 445/24 |
| 2002/0008838 A1 * | 1/2002 | Matsuda ...................... 349/187 |
| 2002/0062787 A1 * | 5/2002 | Hashizume et al. ......... 118/664 |
| 2002/0140148 A1 * | 10/2002 | Aigner et al. ................... 269/21 |
| 2002/0167780 A1 * | 11/2002 | Sun et al. .................... 361/234 |
| 2003/0174274 A1 * | 9/2003 | Lee et al. ..................... 349/187 |
| 2004/0001177 A1 * | 1/2004 | Byun et al. .................. 349/187 |
| 2005/0020177 A1 * | 1/2005 | Lee et al. ...................... 445/60 |

FOREIGN PATENT DOCUMENTS

| | | |
|---|---|---|
| JP | 51-065656 | 6/1976 |
| JP | 57038414 | 3/1982 |
| JP | 57088428 | 6/1982 |
| JP | 58027126 | 2/1983 |
| JP | 59-057221 | 4/1984 |
| JP | 59-195222 | 11/1984 |
| JP | 60-111221 | 6/1985 |
| JP | 60164723 | 8/1985 |
| JP | 60217343 | 10/1985 |
| JP | 61007822 | 1/1986 |
| JP | 61055625 | 3/1986 |
| JP | 62089025 | 4/1987 |
| JP | 62090622 | 4/1987 |
| JP | 62205319 | 9/1987 |
| JP | 63109413 | 5/1988 |
| JP | 63110425 | 5/1988 |
| JP | 63128315 | 5/1988 |
| JP | 63311233 | 12/1988 |
| JP | 02052417 A * | 2/1990 |
| JP | 05127179 | 5/1993 |
| JP | 05-154923 | 6/1993 |
| JP | 05265011 | 10/1993 |
| JP | 05281557 | 10/1993 |
| JP | 05281562 | 10/1993 |
| JP | 06051256 | 2/1994 |
| JP | 06148657 | 5/1994 |
| JP | 6160871 | 6/1994 |
| JP | 06-235925 | 8/1994 |
| JP | 06265915 | 9/1994 |
| JP | 06-313870 | 11/1994 |
| JP | 07-084268 | 3/1995 |
| JP | 07128674 | 5/1995 |
| JP | 07181507 | 7/1995 |
| JP | 08-101395 | 4/1996 |
| JP | 08095066 | 4/1996 |
| JP | 08106101 | 4/1996 |
| JP | 08171094 | 7/1996 |
| JP | 08190099 | 7/1996 |
| JP | 08240807 | 9/1996 |
| JP | 09005762 | 1/1997 |
| JP | 09026578 | 1/1997 |
| JP | 09-061829 | 3/1997 |
| JP | 09073075 | 3/1997 |
| JP | 09073096 | 3/1997 |
| JP | 09127528 | 5/1997 |
| JP | 09230357 | 9/1997 |
| JP | 09281511 | 10/1997 |
| JP | 09311340 | 12/1997 |
| JP | 10123537 | 5/1998 |
| JP | 10123538 | 5/1998 |
| JP | 10142616 | 5/1998 |
| JP | 10-177178 | 6/1998 |
| JP | 10221700 | 8/1998 |
| JP | 10282512 | 10/1998 |
| JP | 10-333157 | 12/1998 |
| JP | 10-333159 | 12/1998 |
| JP | 11014953 | 1/1999 |
| JP | 11038424 | 2/1999 |
| JP | 11064811 | 3/1999 |
| JP | 11109388 | 4/1999 |
| JP | 11-133438 | 5/1999 |
| JP | 11-142864 | 5/1999 |
| JP | 11174477 | 7/1999 |
| JP | 11212045 | 8/1999 |
| JP | 11-248930 | 9/1999 |
| JP | 11-326922 | 11/1999 |
| JP | 11344714 | 12/1999 |
| JP | 2000-002879 | 1/2000 |
| JP | 2000029035 | 1/2000 |
| JP | 2000-056311 | 2/2000 |
| JP | 2000-066165 | 3/2000 |
| JP | 2000-137235 | 5/2000 |
| JP | 3000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 | 2/2001 |
| JP | 2001-042341 | 2/2001 |
| JP | 2001-051284 | 2/2001 |
| JP | 2001-066615 | 3/2001 |
| JP | 2001-091727 | 4/2001 |
| JP | 2001-117109 | 4/2001 |
| JP | 2001117105 | 4/2001 |
| JP | 2001-133745 | 5/2001 |
| JP | 2001-133799 | 5/2001 |
| JP | 2001133794 | 5/2001 |
| JP | 2001142074 | 5/2001 |
| JP | 2001147437 | 5/2001 |
| JP | 2001-166272 | 6/2001 |
| JP | 2001-166310 | 6/2001 |
| JP | 2001154211 | 6/2001 |
| JP | 2001-183683 | 7/2001 |
| JP | 2001-209052 | 8/2001 |
| JP | 2001-209060 | 8/2001 |
| JP | 2001-222017 | 8/2001 |
| JP | 2001-235758 | 8/2001 |
| JP | 2001-215459 | 9/2001 |
| JP | 2001255542 | 9/2001 |
| JP | 2001264782 | 9/2001 |
| JP | 2001-201750 | 10/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |

| | | | | | | |
|---|---|---|---|---|---|---|
| JP | 2001-330837 | 11/2001 | | JP | 2002107740 | 4/2002 |
| JP | 2001330840 | 11/2001 | | JP | 2002122872 | 4/2002 |
| JP | 2001-356353 | 12/2001 | | JP | 2002122873 | 4/2002 |
| JP | 2001356354 | 12/2001 | | JP | 2002080321 | 6/2002 |
| JP | 2002014360 | 1/2002 | | JP | 2002202512 | 7/2002 |
| JP | 2002023176 | 1/2002 | | JP | 2002202514 | 7/2002 |
| JP | 2002049045 | 2/2002 | | JP | 2002214626 | 7/2002 |
| JP | 2002082340 | 3/2002 | | KR | 2000-0035302 A1 | 6/2000 |
| JP | 2002090759 | 3/2002 | | | | |
| JP | 2002090760 | 3/2002 | | | | |

\* cited by examiner

STAGE STRUCTURE IN BONDING MACHINE AND METHOD FOR CONTROLLING THE SAME

This application claims the benefit of the Korean Application Nos. P2002-0014998 and P2002-0015077, both filed on Mar. 20, 2002, which are hereby incorporated by reference for all purposes as if fully set forth herein.

This application incorporates by reference two co-pending applications, Ser. No. 10/184,096, filed on Jun. 28, 2002, entitled "SYSTEM AND METHOD FOR MANUFACTURING LIQUID CRYSTAL DISPLAY DEVICES" and Ser. No. 10/184,088, filed on Jun. 28, 2002, entitled "SYSTEM FOR FABRICATING LIQUID CRYSTAL DISPLAY AND METHOD OF FABRICATING LIQUID CRYSTAL DISPLAY USING THE SAME", as if fully set forth herein.

BACKGROUND OF THE INVENTION

1. Field of the Invention

The present invention relates to a bonding machine for fabrication of a liquid crystal display, and, more particularly, to a stage structure in a bonding machine for fabricating a liquid crystal display (LCD) having the liquid crystal dropping method applied thereto, and a method for controlling a bonding machine.

2. Background of the Related Art

Keeping pace with development of an information oriented society, demands on displays increase gradually in a variety of forms, and, recently to meet the demands, different flat display panels, such as Liquid Crystal Display (LCD), Plasma Display Panel (PDP), Electro Luminescent Display (ELD), Vacuum Fluorescent Display (VFD), and the like, have been under development, and some of which are employed as displays in various apparatuses.

The LCDs have been used most widely as mobile displays while the LCD replaces the Cathode Ray Tube (CRT) owing to features and advantages of excellent picture quality, lightweight, thin, and low power consumption. Besides the mobile type LCDs, such as a notebook computer monitors, LCDs are under development for television (TVs) for receiving and displaying broadcasting signals, and monitors of computers.

Despite the various technical developments in the LCD for serving as a display in different fields, the efforts for enhancing a picture quality of the LCD as a display are inconsistent with the features and advantages of the LCD in many aspects. Therefore, for the LCD being employed in various fields as a general display, a key for development of the LCD lies in how much the LCD is made to implement a high quality picture, such as high definition and high luminance, and a large sized screen while the LCD is maintained to have the features of light weight, thin, and low power consumption.

The LCD may be fabricated by a generally known LCD injection method, in which one substrate having sealant coated thereon so as to form an injection hole is bonded to the other substrate under a vacuum, and liquid crystal is injected therein through the injection hole in the sealant, or by a liquid crystal dropping method. The liquid crystal dropping method is disclosed in Japanese Patent Laid Open Publication Nos. 2000-284295, and 2001-005405, in which one substrate having liquid crystal dropped thereon and the other substrate are provided, and the two substrates, placed oppositely in a vertical direction, are brought closer to bond the two substrates.

Of the two methods, the liquid crystal dropping method is advantageous in that many steps (such as the step of formation of the liquid crystal injection hole, the step of injection of liquid crystal, and the step of sealing the liquid crystal injection hole) can be omitted, and less equipment is required. Accordingly, studies for development of various apparatuses for use in the liquid crystal dropping method have been made.

Figure 1:
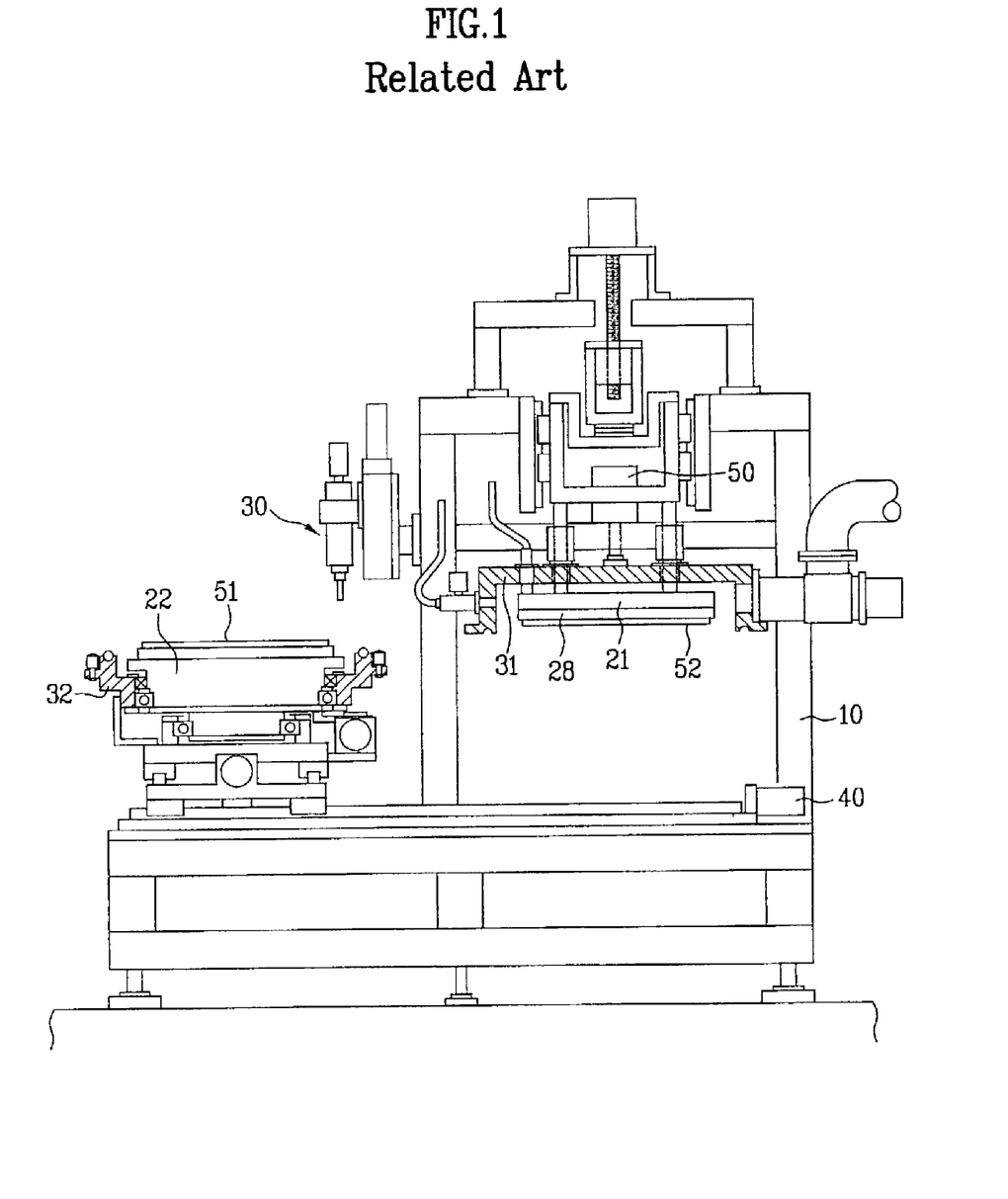
FIG. 1 illustrates a substrate bonding machine having a related art liquid crystal dropping method applied thereto in dropping the liquid crystal.
Figure 2:
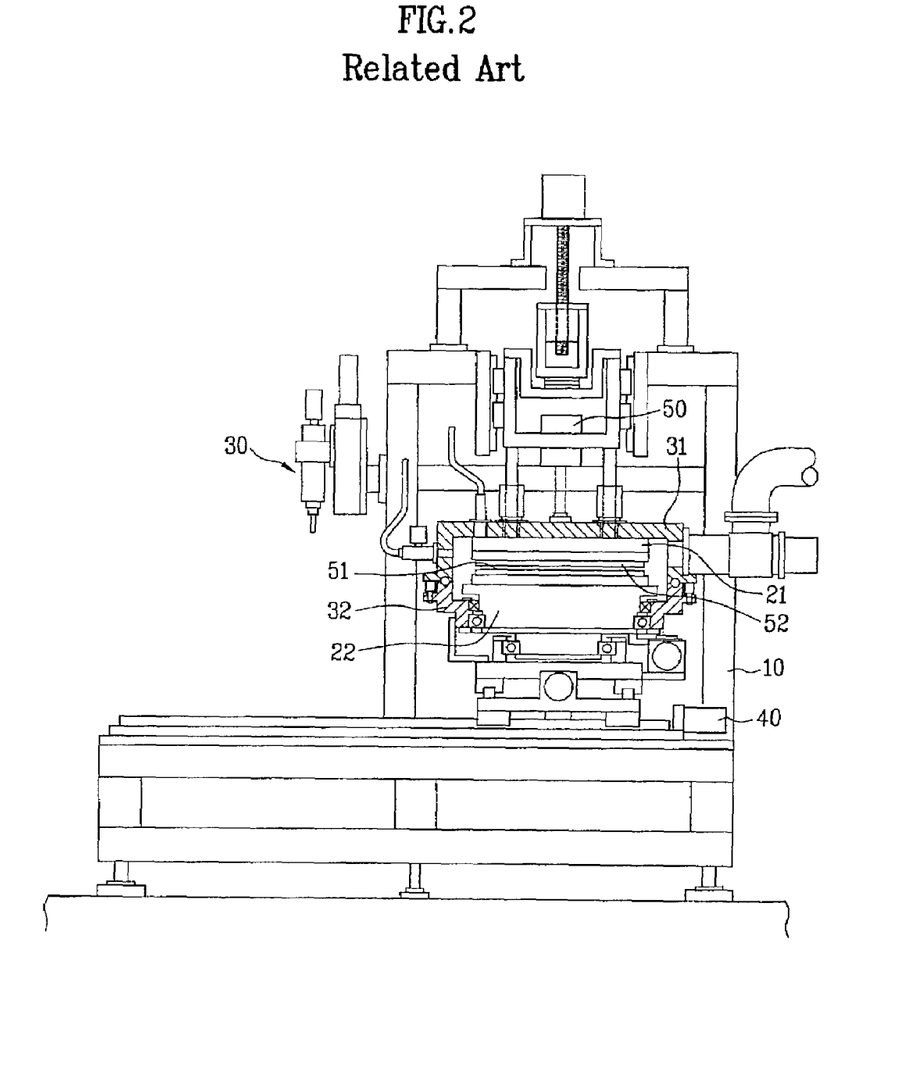
FIG. 2 illustrates a substrate bonding machine having a related art liquid crystal dropping method applied thereto in bonding the substrates.

FIGS. 1 and 2 illustrate a related art bonding machine having the liquid crystal dropping method applied thereto.

The related art bonding machine is provided with a frame 10 forming an outer shape, stage parts 21 and 22, a sealant outlet part (not shown), a liquid crystal dropping part 30, chamber parts 31 and 32, chamber moving means, and stage moving means.

The stage parts have an upper stage 21 and a lower stage 22, and there is an electro-static chuck 28 at a bottom the upper stage 21. The electro-static chuck 28, which is an insulating material plate having two rectangular recesses, each with a plate electrode built therein covered with a dielectric material of which main surface is on the same plane with a bottom surface of the electro-static chuck 28. Each of the buried plate electrodes (not shown) is connected to a positive/negative DC power through an appropriate switch. When a positive or a negative voltage is applied to the plate electrodes, a negative or positive charge is induced at the main surface of the dielectric material on the same plane with the bottom surface of the electro-static chuck 28, to adsorb the substrate by a Coulomb force generated between the substrate 51 and the transparent electrode film caused by the charge.

The sealant outlet part and the liquid crystal dropping part 30 is fitted to a side of a location at which the frame is bonded, and the chamber part has an upper chamber unit 31 and a lower chamber unit 32, detachable from each other.

The chamber moving means has a driving motor 40 for selective movement of the lower chamber unit 32 to a location the bonding is made, or to a location discharge of the sealant and dropping of the liquid crystal is made, and the stage moving means has a driving motor 50 for driving the upper stage 21 upward or downward, selectively.

The steps of a method for fabricating an LCD by using the foregoing related art bonding machine will be explained in detail.

First, the second substrate 52 is loaded on the lower stage 22 in the lower chamber unit, and the lower chamber unit 32 is moved toward a location the upper stage 21 is located by driving the driving motor 40 of the chamber moving means.

Under this state, the upper stage 21 produces a vacuum adsorbing force, and adsorbs the second substrate 52 by vacuum, and the lower chamber unit 32 is moved to a location for coating sealant and dropping liquid crystal by driving the driving motor 40.

Then, the first substrate 51 is brought into the lower stage 22, and, then, the lower stage 22 produces a vacuum adsorption force, and vacuum adsorbs the first substrate 51. This state is illustrated in FIG. 1.

Under this state, the lower chamber unit 32 having the lower stage 22 is moved to a location for coating sealant and dropping the liquid crystal by the chamber moving means 40.

Then, when the sealant coating and the liquid crystal dropping are finished by the sealant outlet part and the liquid crystal dropping part 30, the lower chamber unit 32 is moved to a location for bonding the substrates by the chamber moving means 40, again, as shown in FIG. 2.

Then, chamber units 31 and 32 are bonded by the chamber moving means 40, to close the spaces where the respective stages 21 and 22 are located respectively, and the spaces are evacuated by separate vacuum means. In this instance, the second substrate 52 vacuum adsorbed at the upper stage falls down onto a catch stop pawl (not shown), and the electro-static chuck 28, having a voltage applied thereto at a time the chamber is evacuated adequately, adsorbs the second substrate 52 on the catch stop pawl.

Then, the upper stage 21 is moved downward such that the second substrate 52 adsorbed at the upper stage 21 is brought into contact with, and pressed down to, the first substrate 51 adsorbed at the lower stage 22, to bond the substrates, thereby finishing fabrication of the LCD.

However, the foregoing related art assembler (bonding machine) has the following problems.

First, because the related art bonding machine has a system in which the sealant coating and the liquid crystal dropping are made on the substrate having the thin film transistors formed thereon, and the substrate having the color filter layer formed thereon, the related art bonding machine becomes bulky by the parts for carrying out the sealant coating and the liquid crystal dropping.

Particularly, the bonding machine for large sized LCDs required recently becomes more bulky, such that fabrication of the large sized LCDs is unfavorable.

Second, if the sealing in the coupling between the lower chamber unit and the upper chamber unit is not perfect, the substrates may be damaged during the bonding, and the bonding may be defective due to infiltration of air through a leakage part. Accordingly, parts for prevention of air leakage is additionally required in the vacuum state, and the required accuracy causes difficulty.

Third, the electro-static chuck of two plate electrodes, absorbing the substrate by having voltages of different poles applied thereto, are likely to drop the substrate as the electro-static absorbing force is not adequate. Moreover, the large sized glass substrate cannot be adsorbed.

Fourth, the alignment of the substrates by moving the lower chamber unit in a lateral direction in bonding the substrates is very difficult, which increases a time period required for the entire fabrication. That is, because there are many movements required for the fabrication, such as the movement of the lower chamber unit to a location for dropping the liquid crystal or coating the sealant onto a substrate held at the lower stage, and the returning of the lower chamber to a location for bonding the substrates again when above process is finished, accuracy of the substrate alignment cannot be secured.

Fifth, as explained, even if the power to the electro-static chuck 28 is cut off for separating the substrates from the upper/lower stages after the bonding is finished, the potential remaining between the upper stage and the bonded substrates may impede easy separation of the bonded substrates, which causes misalignment of the bonded substrates, and deterioration of adhesive force of the sealant.

SUMMARY OF THE INVENTION

Accordingly, the present invention is directed to a stage structure in a bonding machine for fabricating a liquid crystal display, and a method for controlling a bonding machine that substantially obviates one or more of the problems due to limitations and disadvantages of the related art.

An advantage of the present invention is to provide a stage structure in a bonding machine for fabricating a liquid crystal display (LCD), which can provide a bonding machine which has a size optimized to an overall layout, movement ranges, and directions of stages simplified for smooth alignment of the substrates. The time period required for fabrication of one LCD is shortened for smooth process design in relation to other processes, and which can separate the substrates from the stage more smoothly in releasing the electro-static adsorption after the electro-static adsorption, and a method for fabricating a bonding machine is provided.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the stage structure in a bonding machine includes a plate movably fitted in a bonding chamber; a plurality of blocks of electro-static chucks fitted to the plate for providing an electro-static force hold a substrate; a plurality of vacuum holes in the plate around the electro-static chucks for receiving a vacuum force and adsorbing and holding the substrate; and a plurality of alignment mark confirming holes in a periphery of the plate confirming of the marks for aligning the adsorbed substrate.

The block of electro-static chucks includes a plurality of plate electrode pairs for having voltages of opposite polarities applied thereto.

The plate electrode has a voltage of a polarity opposite to polarities of adjacent plate electrodes applied thereto.

The electro-static chucks in each of the blocks have different sizes.

The plurality of alignment mark confirming holes includes at least two rough mark holes and at least four fine mark holes.

The stage structure in a bonding machine further includes lift bar holes in the plate for supporting the substrate during loading the substrate, or lifting the substrate from the stage during unloading.

The electro-static chucks include six blocks.

The one block of electro-static chucks includes four plate electrodes.

The plate electrode has a voltage of a polarity opposite to polarities of adjacent plate electrodes applied thereto.

The stage structure in a bonding machine further includes at least one or more than one spare holes in a central part of the plate.

The plurality of alignment mark confirming holes include at least one hole in a cut away part of a corner of the electro-static chuck in each of corners of the upper stage.

The stage structure in a bonding machine further includes a plurality of fixing holes in a periphery of the plate for fixing the bonded substrates.

In another aspect of the present invention, there is provided a stage structure in a bonding machine having an upper stage and a lower stage including a plurality of blocks of first electro-static chucks fitted to the upper stage for providing an electro-static force to hold a substrate; a plurality of first vacuum holes in the upper stage around the electro-static chucks for receiving a vacuum force to adsorb and hold the substrate; a plurality of first alignment mark confirming holes in a periphery of the upper stage for confirming marks for aligning the adsorbed substrate; a plurality of blocks of second electro-static chucks fitted to the lower stage for providing an electro-static force to hold the substrate; and a plurality of second vacuum holes in the lower stage around the electro-static chucks for receiving a vacuum force to adsorb and hold the substrate.

The stage structure in a bonding machine further includes a plurality of first fixing holes in a periphery of the upper stage for fixing the bonded substrates, and a plurality of second fixing holes in a periphery of the lower stage for fixing the bonded substrates.

The plurality of first fixing holes and the plurality of second fixing holes are formed at locations different from each other.

The stage structure in a bonding machine further includes lift bar holes in the lower stage for supporting the substrate during loading the substrate, or lifting the substrate from the stage during unloading.

The stage structure in a bonding machine further includes a plurality of second alignment mark confirming holes in a periphery of the lower stage for confirming marks for aligning the adsorbed substrate.

The plurality of first or second alignment mark confirming holes include at least two rough mark holes and at least four fine mark holes.

The second alignment mark confirming hole has a light provided therethrough.

The electro-static chucks include six blocks, and each block includes four plate electrodes.

In further aspect of the present invention, there is provided a method for controlling a bonding machine having upper and lower stages each with electro-static chucks, each chuck having a plurality of plate electrodes, the method including: applying voltages of either negative or positive polarity to the plate electrodes in the electro-static chuck, and the upper and lower stages adsorbing respective substrates by using the electro-static chucks; moving the upper and the lower stages, to bond the substrates, and cutting off the voltages applied to the electro-static chucks; applying voltages of opposite polarities to the plate electrodes respectively, and moving the upper or lower stage.

In still a further aspect of the present invention, there is provided a method for controlling a bonding machine having upper and lower stages, each with electro-static chucks, each chuck having a plurality of plate electrodes, the method including: loading a first substrate and a second substrate in the bonding chamber; evacuating the bonding chamber; applying voltages of either negative or positive polarity to the plate electrodes in the electro-static chuck, and the upper and lower stages adsorbing respective substrates by using the electro-static chucks; moving the upper and the lower stages, to bond the substrates, and cutting off the voltages applied to the electro-static chucks; and applying voltages of opposite polarities to the plate electrodes respectively, and moving the upper or lower stage.

The method for controlling a bonding machine further includes aligning the substrates adsorbed at the upper and lower stages after applying voltages of either negative or positive polarity to the plate electrodes.

The method for controlling a bonding machine further includes venting the bonding chamber for applying pressure to the bonded two substrates, and unloading the pressed first, and second substrates, after the step of cutting off the voltages applied to the electro-static chucks; applying voltages of opposite polarities to the plate electrodes respectively, and moving the upper or lower stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 3:
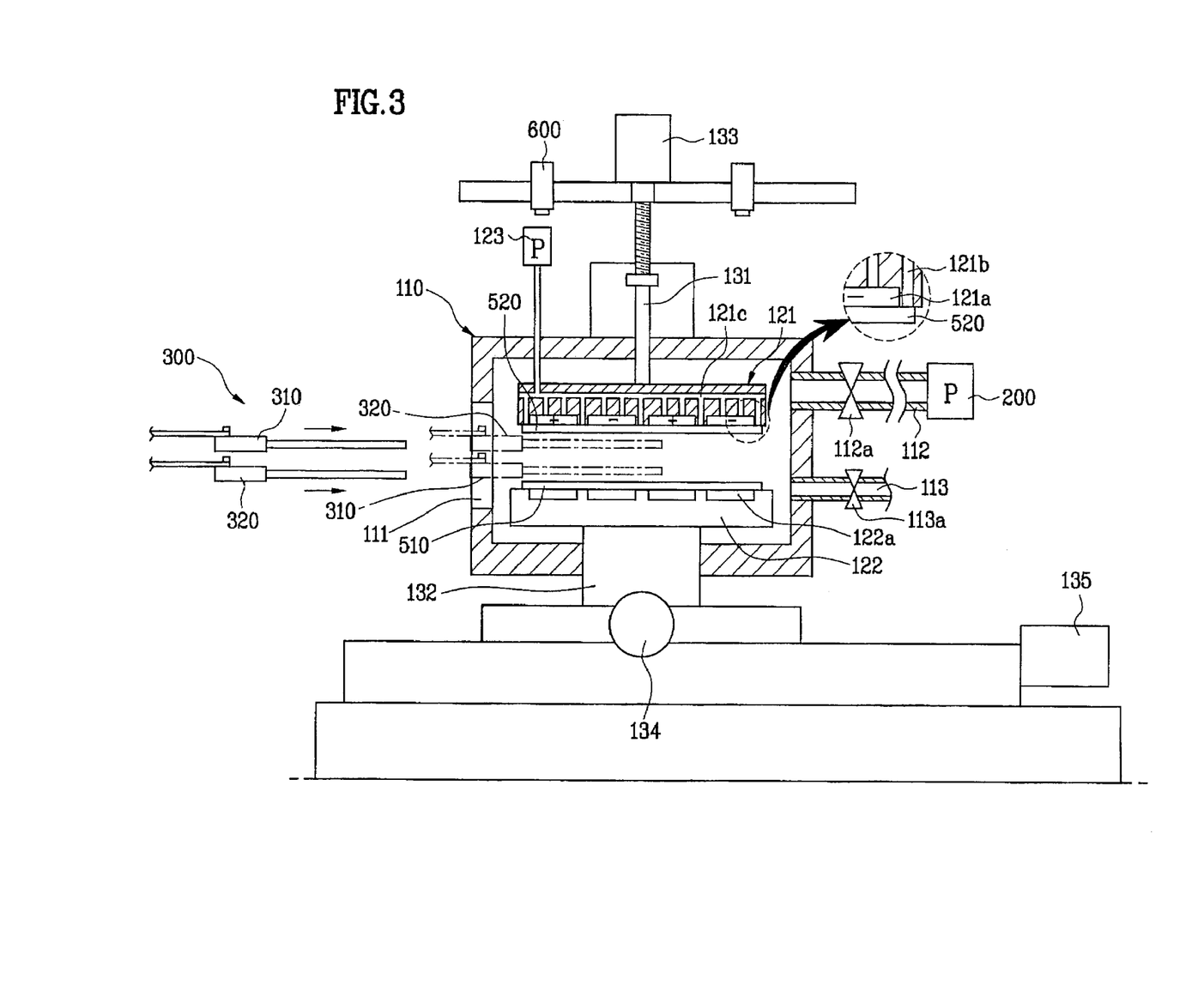
FIG. 3 illustrates a bonding machine for fabricating an LCD having a liquid crystal dropping method applied thereto in accordance with an embodiment of the present invention, schematically.

FIG. 3 illustrates a bonding machine for fabricating a liquid crystal device (LCD) having a liquid crystal dropping method applied thereto in accordance with an embodiment of the present invention, schematically.

It is suggested that the bonding machine of the present invention includes a bonding chamber 110, a stage part, a stage moving device (unlabeled), an evacuation device (unlabeled), a vent device (unlabeled), and a loader part 300.

The bonding chamber 110 includes an inside space for carrying out bonding by pressing the substrates to each other, and bonding by using a pressure difference in succession by selectively making the space a vacuum state, or an atmospheric state, and an opening 111 in one side for moving the substrate in or out.

The bonding chamber 110 further includes an air extraction tube 112 connected to one side thereof for extracting air from the inside space of the bonding chamber 110 by an air suction power from the evacuation device, and a vent tube 113 connected to the one side thereof for introducing external air or other gas $N_2$ into the bonding chamber 110, for placing the bonding chamber 110 in the vacuum state, or in the atmospheric state, selectively.

The air extraction tube 112 and the vent tube 113 have electronically controlled valves 112a and 113a respectively, for selectively opening/shutting of tube lines.

Together with this, it is suggested to provide a door (not shown) to the opening 111 in the bonding chamber 110 for selectively closing the opening.

The door may be a general sliding, or rotating type door, or other device that can close an opening, and the sliding, or rotating type door has a sealing member for sealing a gap, of which detail is not shown in the drawing.

The stage part includes an upper stage 121 and a lower stage 122 fitted in an upper space and a lower space respectively, in the bonding chamber 110 to face each other, for holding the substrates 510 and 520 brought into the bonding chamber 110 by the loader part 300 at required processing positions.

It is suggested that the upper stage 121 has at least one Electro Static Chuck (ESC) 121a fitted to a recess in a bottom of the upper stage 121 for holding the substrate by electro static force, and at least one vacuum hole 121b for adsorbing and holding the substrate by vacuum.

Though the present embodiment suggests at least two ESCs 121a to form pairs each having DC voltages of opposite polarities applied thereto for electro static holding of the substrate, the present invention is not limited to this, but may be designed such that one ESC has the DC voltages of opposite polarities applied thereto for providing the electro static power.

The upper stage 121 has a plurality of vacuum holes 121b formed around each of the ESCs 121a fitted to the bottom of the upper stage 121 and connected to single or multiple tube lines 121c for communication with a vacuum pump 123 connected to the upper stage 121.

Together with this, it is suggested that the lower stage 122 has at least one ESC 122a on a top surface of the lower stage for providing electro static power to hold the substrate, and at least one vacuum hole (not shown) for adsorbing and holding the substrate by vacuum.

The ESC and the vacuum hole may, or may not be identical to the same of the upper stage 121, but arrangements of electro static power providing devices and the vacuum holes are made taking an overall fabrication process of the substrates or each liquid crystal coating region into account.

The stage moving device includes a moving shaft 131 for selectively moving the upper stage 121 up/down, a rotating shaft 131 for selective left/right rotation of the lower stage 122, and driving motors 133 and 134 fitted to inside or outside of the chamber 110 coupled to the stages 121 and 122 via shafts, respectively.

The unexplained symbol 135 denotes driving means driven for lateral movement of the lower stage 122 in alignment of the substrates.

The bonding machine of the present invention is provided with a suction pump for transmitting a suction force so that the inside space of the bonding chamber 110 achieves a vacuum state selectively, and for being driven to produce a general air suction force. A space the suction pump 200 is provided with is formed such that the space is in communication with the air extraction tube 112 of the bonding chamber 110.

The loader part, a device separate from the bonding chamber 110 and the various components in the bonding chamber 110, is fitted to an outside of the bonding chamber 110, for receiving and selectively carrying the first substrate 510 having the liquid crystal dropped thereon, or the second substrate 520 having the sealant coated thereon, into or out of, the bonding chamber 110.

The loader part includes a first arm 310 for carrying the first substrate 510 having the liquid crystal dropped thereon, and a second arm 320 for carrying the second substrate 520 having the sealant coated thereon, wherein it is designed that the first arm 310 is positioned above the second arm 320 in a standby state before the first and second substrates 510 and 520, loaded on relevant arms 310 and 320, are carried into the inside space of the bonding chamber 110.

Moreover, it is additionally suggested that the bonding machine of the present invention further includes an alignment device 600 for confirming an alignment state between the substrates 510 and 520 carried into the bonding chamber 110 by the loader part and loaded on the stages 121 and 122 respectively, when, although the alignment device 600 may be fitted to at least one of an outside or an inside of the bonding chamber 110, the present invention suggests that the alignment device 600 is fitted to the outside of the bonding chamber 110, as one embodiment.

Thus, the foregoing bonding machine in accordance with an embodiment of the present invention is made to have an overall size significantly reduced in comparison to the related art bonding machine by making the formation of the substrates to be done in other processes separately, and can shorten a fabrication time period significantly by making the bonding machine to carry out a simple bonding process only.

Moreover, the foregoing system of the present invention permits faster and more accurate alignment of the substrates by permitting the lower stage to move within an extremely limited range only. Different from the related art, since the foregoing system of the present invention does not have a two pieced chamber to couple/decouple selectively, but a one pieced chamber, the foregoing system of the present invention can eliminate leakage problems caused when two chambers are coupled, and can dispense with many components required for the prevention of the leakage.

Figure 4:
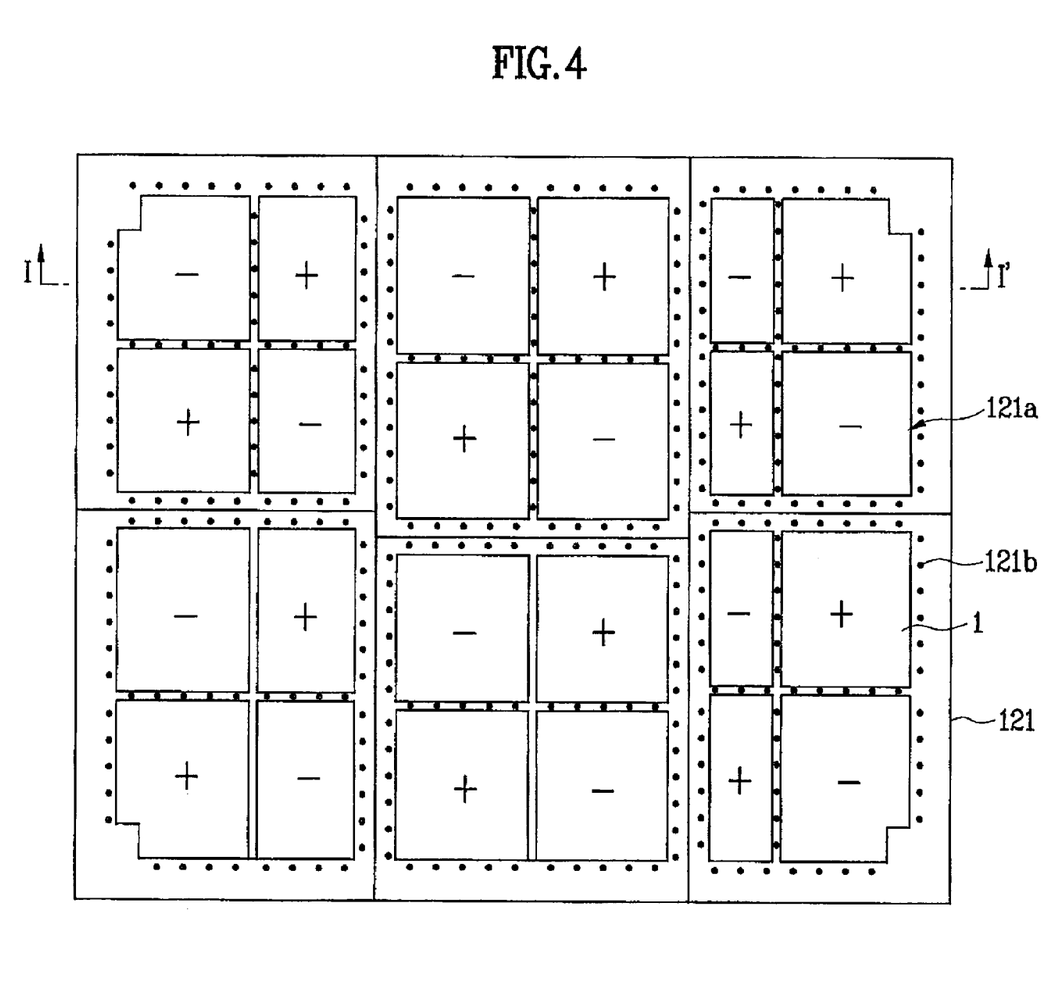
FIG. 4 illustrates a plan view of an electro-static chuck in a bonding machine in accordance with an embodiment of the present invention, schematically.
Figure 5:
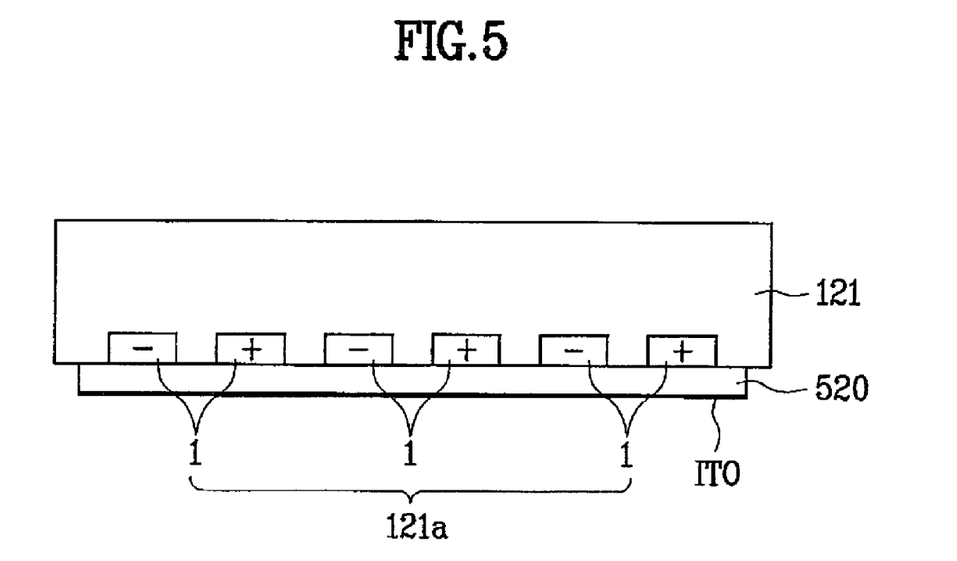
FIG. 5 illustrates a section across a line I–I' in FIG. 4.

The upper stage and the lower stage will be explained in detail. FIG. 4 illustrates a plan view of an electro-static chuck in a bonding machine in accordance with an embodiment of the present invention schematically. FIG. 5 illustrates a section across a line I–I' in FIG. 4.

Referring to FIG. 4, there are a plurality of blocks (6 blocks) of electro-static chuck 121a arranged on a surface of the upper or lower stage 121 or 122 for providing an electro-static force and adsorbing the substrate, wherein each block of the electro-static chuck 121a includes at least one pair of plate electrodes 1 for applying DC currents of opposite polarities (negative/positive) thereto, respectively. There is a plurality of vacuum holes 121b in the upper stage 121 around the electro-static chucks 121a, for receiving the vacuum force to adsorb and hold the substrate.

Therefore, when either a positive, or negative voltage is applied to the plate electrodes 1, to induce either a negative or positive charge at the upper/lower stages 121 and 122, the substrate is adsorbed by a Coulomb force generated between a conductive layer such as indium tin oxide (ITO) used for transparent electrodes, such as a common electrode, or pixel electrodes, are formed on the glass substrate 520, and the upper stage by the charges.

Figure 6:
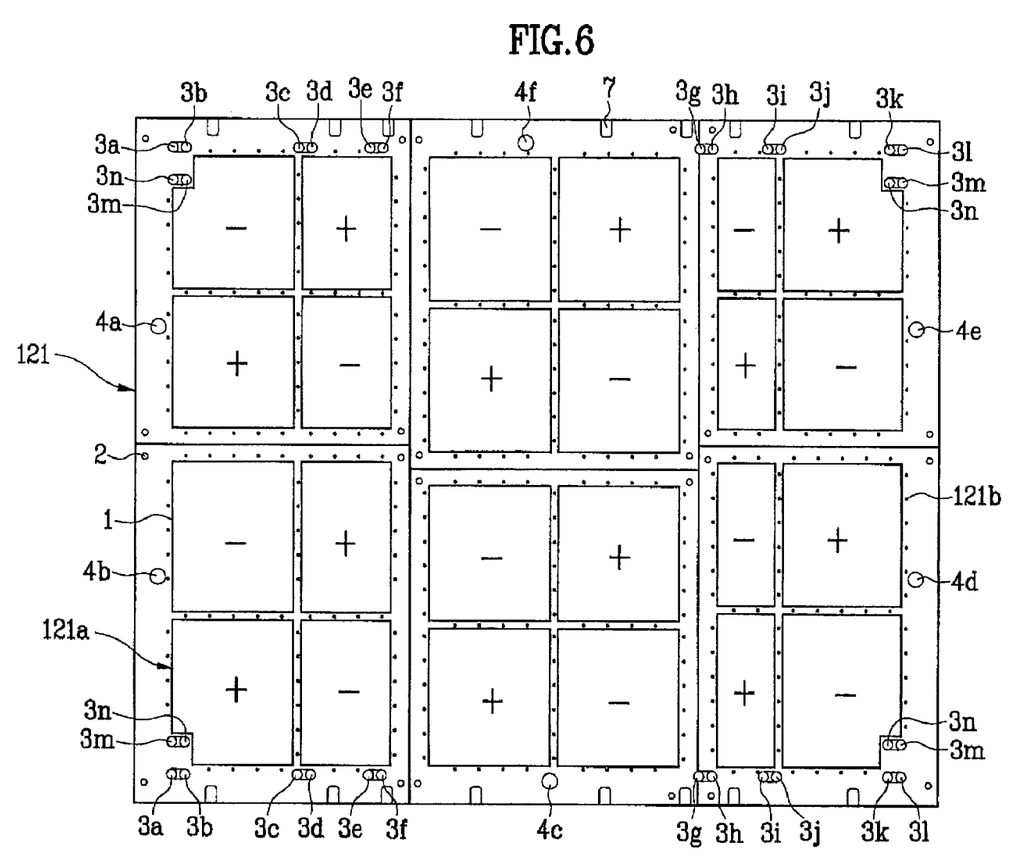
FIG. 6 illustrates a detailed plan view of an upper stage in a bonding machine in accordance with an embodiment of the present invention.
Figure 7:
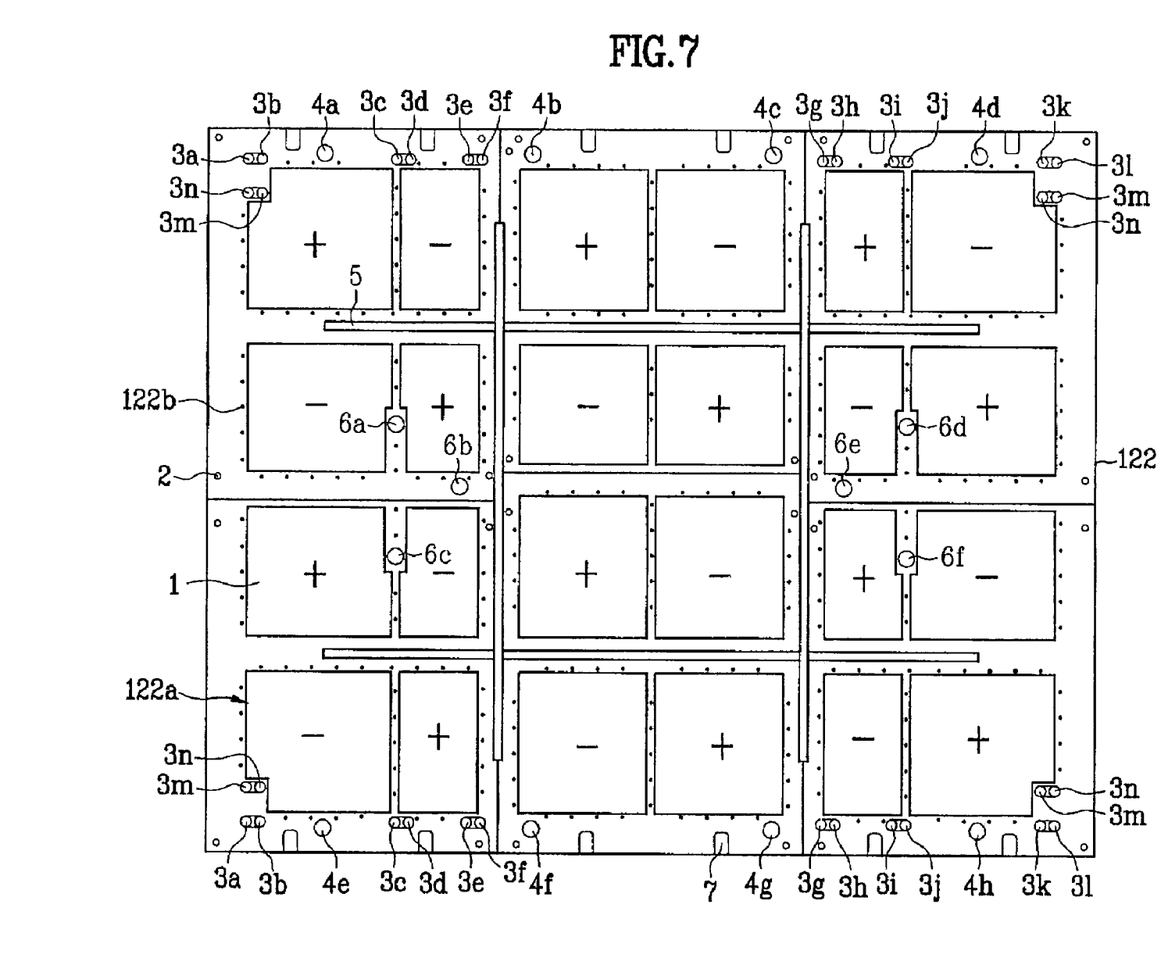
FIG. 7 illustrates a detailed plan view of a lower stage in a bonding machine in accordance with an embodiment of the present invention.

The upper stage and the lower stage having the electro-static chucks and the other elements formed thereon will be explained in detail. FIG. 6 illustrates a detailed plan view of an upper stage in a bonding machine in accordance with an embodiment of the present invention. FIG. 7 illustrates a detailed plan view of a lower stage in a bonding machine in accordance with an embodiment of the present invention.

Referring to FIG. 6, there are a plurality of blocks (6 blocks) of electro-static chucks 121a each fitted in a recess in a flat surface of the upper stage 121 for providing an electro-static force to adsorb the substrate, wherein each of the blocks of electro-static chucks 121a includes a plurality of pairs of plate electrodes 1 (four plate electrodes), for applying DC currents of opposite polarities to the plate electrodes 1 in each of the pairs, respectively. The blocks of electro-static chucks 121a have forms different from one another, and fastened with fastening means to the upper stage 121, for an example, with fastening bolts 2.

The electro-static chuck 121a may include at least one block having four, or more than four plate electrodes 1, and formed opposite to cell regions (active regions) of the substrate.

There are a plurality of vacuum holes 121b in the upper stage 121 around the electro-static chucks 121a, for receiving the vacuum force to adsorb and hold the substrate.

There are holes 3b, 3d, 3f, 3g, 3i, and 3k for confirming rough alignment marks and holes 3a, 3c, 3e, 3h, 3j, and 3l for confirming fine align marks, in the upper stage 121 around the electro-static chuck 121 a opposite to the alignment device 600, and there are corner parts of the plate electrodes 1 cut in 'L' forms at corner parts of the upper stage having holes 3m, and 3n formed therein for confirming the rough or fine alignment marks. That is, there are holes 3a–3l in corner parts (four parts) of the upper stage, and upper and lower side parts of the upper stage formed in pairs, for confirming the rough alignment marks and the fine align marks, and there are holes 3a–3l in corner parts of the plate electrodes 1 formed in pairs, for confirming the rough alignment marks and the fine alignment marks. Though a general substrate has the rough and fine alignment marks formed at corners of the substrate, there are as many holes for confirming the alignment marks of different sizes of substrates as there are different sizes of substrates.

Therefore, when the substrate is the largest one, alignment marks thereon are confirmed by using the four pairs of holes 3a, and 3b, and 3k, and 3l, in corner parts of the upper stage, and when the substrate is smaller than the largest one, the alignment marks are confirmed by using rest of the holes. That is, when the substrate is the largest, a minimum of two rough alignment mark holes in the corner parts are adequate, and more than four rough alignment mark holes are required for coping with different models, or sizes, if needed, and a minimum of four fine alignment mark holes are adequate, and more than six fine alignment mark holes are required for coping with different models, or sizes, if needed.

Moreover, the plurality of alignment mark confirming holes is formed in symmetry with respect to a central part.

Though in the explanation of the process for bonding the substrates by using the bonding machine it is not discussed, there is a high possibility of misalignment of the bonded substrates caused by distortion of the bonded substrates coming from pressure change and introduction of dry air or gas in venting of the bonding chamber for uniform application of pressure to the two substrates after the upper stage 121 is moved down and applies pressure to the substrates adsorbed at the upper stage and the lower stage. Therefore, a process for fixing the two bonded substrates is carried out before the venting. In the fixing process, light is used for setting the sealant partially, or heat or pressure is applied for setting the bonded two substrates. Thus, in order to fix the bonded two substrates, it is required to direct light, or apply heat to the sealant, additionally.

Accordingly, there are holes 4a, 4b, 4c, 4d, 4e, and 4f in an outer periphery of the electro-static chuck 121a of the upper stage 121, for directing an ultraviolet (UV) light or partly applying heat to the sealant. That is, the holes are formed at locations corresponding to locations of the sealant (fixing sealant) formed between the two substrates. Though there are six fixing holes shown in the drawing, a number of the fixing holes equal to four or more than four are adequate.

Though not shown, there may be spare holes at locations other than the outer periphery of the upper stage, and there are recesses 7 in the outer periphery of the upper stage 121 in parts where a clamp is used for entry.

Referring to FIG. 7, similarly, there are also a plurality of blocks (6 blocks) of electro-static chucks 122a each fitted in a recess in the lower stage 122 (plate) for providing an electro-static force to adsorb the substrate, wherein each of the blocks of electro-static chucks 122a includes a plurality of pairs of plate electrodes 1 (four plate electrodes), for applying DC currents of opposite polarities to the plate electrodes 1 in each of the pairs, respectively. The blocks of electro-static chucks 122a have forms different from one another, and fastened with fastening means to the lower stage 122, for example, with fastening bolts 2.

In the lower stage 122 the electro-static chuck 122a may also include at least one block having four or more than four plate electrodes 1, and formed opposite to cell regions (active regions) of the substrate.

However, the polarities of the DC currents applied to the electro-static chucks of plate electrodes 1 in the upper stage and the lower stage are opposite to each other (Compare FIGS. 6 and 7).

There are a plurality of vacuum holes 122b in the lower stage 121 around the electro-static chucks 122a, for receiving the vacuum force to adsorb and hold the substrate.

Similar to the upper stage, there are holes 3b, 3d, 3f, 3g, 3i, and 3k for confirming rough alignment marks and holes 3a, 3c, 3e, 3h, 3j, and 3l for confirming fine alignment marks in the upper stage 121 around the electro-static chuck 121a opposite to the alignment device 600, and there are corner parts of the plate electrodes 1 cut in 'L' forms at corner parts of the upper stage having holes 3m and 3n formed therein for confirming the rough or fine alignment marks. That is, there are holes 3a–3l in corner parts (four parts) of the upper stage and upper and lower side parts of the upper stage formed in pairs for confirming the rough alignment marks and the fine alignment marks, and there are holes 3a–3l in corner parts of the plate electrodes 1 formed in pairs, for confirming the rough alignment marks and the fine alignment marks. Though a general substrate has the rough and fine alignment marks formed at corners of the substrate, there are as many holes for confirming the alignment marks of different sizes of substrates as there are different sizes of substrates.

Therefore, when the substrate is the largest one, alignment marks thereon are confirmed by using the four pairs of holes 3a, and 3b, and 3k, and 3l, in corner parts of the upper stage, and when the substrate is smaller than the largest one, the alignment marks are confirmed by using rest of the holes. That is, when the substrate is the largest, a minimum two rough alignment mark holes in the corner parts are adequate, and more than four rough alignment mark holes are required for coping with different models, or sizes, if needed, and a minimum of four fine alignment mark holes are adequate, and more than six fine alignment mark holes are required for coping with different models or sizes, if needed.

Moreover, there are holes 4a, 4b, 4c, 4d, 4e, 4f, 4g, and 4h in an outer periphery of the electro-static chuck 122a of the lower stage 122, for directing an ultraviolet (UV) light or partly applying heat to the sealant, to fix the substrate. The fixing holes 4a–4h in the lower stage is formed at locations, which are not the same as the locations of the fixing holes 4a–4f in the upper substrate, but other parts. Therefore, the sealant sets at locations of the fixing holes 4a–4f in the upper stage and the fixing holes 4a–4h in the lower stage. Though there are seven fixing holes shown in FIG. 7, a number of the fixing holes equal to four or more than four are adequate.

There are holes 5 in the lower stage for supporting the substrate, or lifting the substrate from a surface of the lower stage when the substrate is loaded on, or unloaded from the lower stage, and there may be spare holes 6a, 6b, 6c, 6d, 6e, and 6f.

If a camera is fitted in an upper stage side for confirming the rough alignment marks and the fine alignment marks, a light is provided from a lower stage side through the mark alignment confirming holes in the lower stage, and opposite to this, if the camera is fitted in a lower stage side, the light is provided through the mark alignment confirming holes in the upper stage, for serving as a back light of the camera.

The rough mark confirming holes, the fine mark confirming holes, and fixing holes in each of the stages may be formed as required according to dummy regions of the substrate held at the stages.

A process for bonding the substrates by using the foregoing bonding machine for an LCD of the present invention, and a method for driving an electro-static chuck of the stages will be explained.

At first, a first substrate having liquid crystal dropped thereon, and a second substrate having sealant coated thereon, are provided. Of course, the first substrate may have both the liquid crystal dropped thereon, and the sealant coated thereon.

As shown in dashed lines in FIG. 3, the loader part 300 puts the first substrate 510 having the liquid crystal dropped thereon on standby on an upper side by using a first arm 310, and receives and puts the second substrate 520 having the sealant coated thereon under the first arm 310 by using the second arm 320.

In this state, when the opening 111 in the bonding chamber 110 is opened, the loader part controls the second arm 320, so that the second arm 320 loads the second substrate 520 having the sealant coated thereon into the bonding chamber 110 through the opened opening. The upper stage 121 is moved downward to an upper side of the second substrate 520, and the vacuum pump 123 connected to the upper stage 121 is put into operation, to adsorb the second substrate 520 carried in by the second arm 320 by the vacuum transmitted to the vacuum holes 121b in the upper stage 121. Then, the upper stage 121 is moved upward, to load the second substrate.

Then, the loader part controls the first arm 310, to load the first substrate 510 having the liquid crystal dropped thereon into the bonding chamber 110, and place on the lower stage 122, makes the lower stage 122 to adsorb the first substrate 510 carried in by the first arm 310 by a vacuum from the vacuum holes (not shown) in the lower stage 122 as the vacuum pump (not shown) connected to the lower stage 122 is put into operation, to hold the first substrate 510 at the lower stage 122.

The second substrate 520 having the sealant coated thereon is carried in before the first substrate 510 having the liquid crystal dropped thereon, for prevention of dust and the like, that can be produced during the carrying in of the second substrate 520, from falling down onto the liquid crystal dropped on the first substrate 510, when the first substrate 510 is carried in before the second substrate 520.

If substrates are bonded on the lower stage from a prior bonding process, loading and unloading are carried out simultaneously for shortening the fabrication time period by making the second arm 320 unload the bonded substrates on the lower stage after the second arm 320 carries in the second substrate.

Upon finishing loading of the substrates 510 and 520 by the foregoing steps, the arms 310 and 320 in the loader part 300 move out of the bonding chamber 110, and the door to the substrate opening 111 in the bonding chamber 110 is put into operation, to close the substrate opening 111, to leave the bonding chamber 110 in a closed state.

Then, though not shown in the drawings, the substrate receiver is brought to a location under the upper stage, the second substrate adsorbed to the upper stage is placed down on the substrate receiver, and evacuation of the chamber is started.

That is, by putting the suction pump (evacuation device) 200 in the evacuation device into operation to generate an air suction force, and making the valve 112a on the air extraction tube 112 to the bonding chamber 110 leave the air extraction tube in an opened state, to transmit the air suction force generated from the suction pump 200 to an inside of the bonding chamber 110, the inside of the bonding chamber 110 can be placed in a vacuum state.

Thus, when the suction pump 200 is driven for a time period to obtain a required vacuum in the bonding chamber 110, the suction pump 200 is stopped, and the air extraction tube 112 is closed by operating the valve 112a.

When the bonding chamber 110 is evacuated fully, power is provided to the ESC 121a and 122a so that the upper stage 121 and the lower stage 122 adsorb respective substrates 510 and 520, electro-statically. Then, the substrate receiver is returned to an original location.

In this instance, approximately 0.1–1 KV is applied when a surface of the substrate having a conductive layer formed thereon is positioned on a stage side, and approximately 3–4 KV is applied when a surface of the substrate having a conductive layer formed thereon is positioned on a side opposite to the stage.

Under this state, the stage moving device drives the driving motor 133, to move the upper stage 121 down close to the lower stage 122, and, along with this, the alignment device 600 determines an alignment state of the substrates 510 and 520 held to respective stages 121 and 122, and provides control signals to the moving shafts 131 and 132 and the rotation shafts coupled to respective stages 121 and 122, for aligning the substrates.

Then, the stage moving device keeps receiving a driving signal, and is driven continuously, to press the second substrate 520 ESC adsorbed to the upper stage 121 down to the first substrate 510 adsorbed to the lower stage 122, thereby completing a primary bonding between the two substrates. The primary bonding herein does not complete a bonding process by moving and pressing the substrates 121 and 122, but the bonding is only to the extent that no air enters between the substrates when the pressure is changed to the atmospheric pressure.

Therefore, when the primary bonding process is finished, the power to the ESC 121a is cut off, to release the substrate from the upper stage, and the upper stage 121 is moved upward. Then, the valve 113a is opened, to introduce dry air or $N_2$ gas into the bonding chamber through the vent tube 113, so that a pressure difference is formed inside of the bonding chamber 110 as the inside of the bonding chamber 110 reaches an atmospheric state gradually, that presses the bonded substrates. Since a space between the first, and second substrates sealed by the sealant is at a vacuum, and the bonding chamber is at the atmospheric pressure, the first, and second substrates are pressed, uniformly.

Eventually, an improved bonding of the substrates can be made, and, upon finishing the bonding, the door 114 to the bonding chamber 110 is driven, to open the substrate opening 111 closed by the door.

Thereafter, the substrate bonding is performed by carrying out unloading of the bonded substrates by means of the loading part 300, and repeatedly carrying out the foregoing series of steps.

In the meantime, as explained, there is possibility that even if the power to the electro-static chuck 28 is cut off for separating the substrates from the upper/lower stages after the bonding is finished, the potential remaining between the upper stage and the bonded substrates may impede easy separation of the bonded substrates, which causes misalignment of the bonded substrates, and deterioration of adhesive force of the sealant.

Therefore, in the present invention, voltages of opposite polarities are applied to the plate electrodes 1 of the ESC momentarily at the time the power to the ESC 121a is cut off, for easy separation of the bonded substrates from the upper stage.

Voltages of either positive or negative polarity are applied to respective plate electrodes 1, to adsorb the substrates by a Coulomb force generated between the ITO conductive layer on the glass substrate 520 and the upper stage, and voltages of polarities opposite to the polarities of the voltages applied for adsorbing the substrates are applied to respective plate electrodes 1 simultaneously with cutting off the power applied to the plate electrodes 1, for easy separation of the bonded substrates from the stage. Then, the charges remaining between the stage and the substrates are offset, which facilitates the easy separation of the bonded substrates from the stage.

As has been explained, the stage structure in a bonding machine for fabricating an LCD, and the method for controlling a bonding machine of the present invention have the following advantages.

First, because the bonding machine of the present invention is separate from apparatuses for dropping liquid crystal and coating sealant, to receive substrates fabricated through other processes, a system required for forming a liquid crystal layer and seals on the substrate loaded on the lower stage in the related art bonding machine can be dispensed with, and an overall size of the bonding machine can be reduced significantly, thereby permitting an effective lay-out design, and saving an installation space.

The independent progression of the dropping of liquid crystal, the coating of sealant, and the bonding of substrates shortens a total fabrication time period.

Third, the extremely restricted movement of the lower stage in the vacuum chamber of the bonding machine of the present invention permits fast and precise position alignment of the substrates by lateral movement of the lower chamber unit similar to the related art. Particularly, different from the related art, the one pieced chamber of the present invention, unlike the two pieced vacuum chamber for selective coupling/decoupling, eliminates the problem of leakage when the two pieced chamber is coupled, and dispense with many components required for prevention of the leakage.

Fourth, since the loader part is designed such that the arm that carries the substrate having no crystal dropped thereon into the vacuum chamber carries the bonded substrates placed on the lower stage in a bonded state bonded through prior processes out of the vacuum chamber in a process of carrying in the substrate, a working time period for carrying in the substrate and carrying out the bonded substrates can be shortened.

Fifth, the provision of, not only the vacuum adsorption holes in the upper and lower stages, but also the electro-static chucks for electro-static adsorption permits stable adsorption of the substrates during evacuation of the bonding chamber, which permits the evacuation and bonding processes to be carried out more smoothly.

Sixth, the mark alignment holes in the stages permit more accurate alignment of the two substrates as the marks in the substrates can be confirmed by the camera in bonding the two substrates.

Seventh, the fixation of the bonded substrates by using the fixing holes in the stages after bonding the two substrates prevents misalignment of the substrates which can occur during venting and improve yield.

Eighth, the easy separation of the bonded substrates from the upper stage by applying voltages of opposite polarities to the plate electrodes in the electro-static chuck before moving up the upper stage after the two substrates are adsorbed and bonded by using the electro-static chuck prevents occurrence of misalignment of the substrate and deterioration of adherence of the sealant caused by a potential remaining between the upper stage 121 and the bonded substrates when the upper stage 121 is moved upward.

It will be apparent to those skilled in the art that various modifications and variations can be made in the stage structure in a bonding machine for fabricating an LCD, and the method for controlling a bonding machine of the present invention without departing from the spirit or scope of the invention. Thus, it is intended that the present invention cover the modifications and variations of this invention provided they come within the scope of the appended claims and their equivalents.

What is claimed is:

1. A stage structure in a bonding machine comprising:
   at least one plate fitted in a bonding chamber;
   a plurality of blocks of electro-static chucks fitted to the at least one plate for providing an electro-static force to hold a substrate;
   a plurality of vacuum holes in the at least one plate around the electro-static chucks for receiving a vacuum force, and adsorbing and holding the substrate; and
   a plurality of alignment mark confirming holes in a periphery of the at least one plate for confirming and aligning the adsorbed substrate.

2. A stage structure as claimed in claim 1, wherein the block of electro-static chucks includes a plurality of plate electrode pairs for having voltages of opposite polarities applied thereto.

3. A stage structure as claimed in claim 2, wherein the plate electrode has a voltage of a polarity opposite to polarities of adjacent plate electrodes applied thereto.

4. A stage structure as claimed in claim 1, wherein the electro-static chucks in each of the blocks have different sizes.

5. A stage structure as claimed in claim 1, wherein the plurality of alignment mark confirming holes include at least two rough mark holes and at least four fine mark holes.

6. A stage structure as claimed in claim 1, further comprising lift bar holes in the at least one plate for one of supporting a substrate during loading of the substrate and lifting the substrate from the stage during unloading.

7. A stage structure as claimed in claim 1, wherein the electro-static chucks include at least six blocks.

8. A stage structure as claimed in claim 7, wherein at least one block of electro-static chucks includes at least four plate electrodes.

9. A stage structure as claimed in claim 8, wherein at least one of the plate electrodes has a voltage of a polarity opposite to polarities of adjacent plate electrodes applied thereto.

10. A stage structure as claimed in claim 1, further comprising at least one spare hole in a central part of the at least one plate.

11. A stage structure as claimed in claim 1, wherein the plurality of alignment mark confirming holes include at least one hole in a cut away part of a corner of the electro-static chuck in each of corners of the at least one plate.

12. A stage structure as claimed in claim 1, further comprising a plurality of fixing holes in a periphery of the plate for fixing the bonded substrates.

13. A stage structure in a bonding machine having an upper stage and a lower stage comprising:
   a plurality of blocks of first electro-static chucks fitted to the upper stage for providing an electro-static force to hold a first substrate;
   a plurality of first vacuum holes in the upper stage around the electro-static chucks for receiving a vacuum force to adsorb and hold the first substrate;
   a plurality of first alignment mark confirming holes in a periphery of the upper stage for confirming marks for aligning the adsorbed first substrate;
   a plurality of blocks of second electro-static chucks fitted to the lower stage for providing an electro-static force to hold a second substrate; and
   a plurality of second vacuum holes in the lower stage around the electro-static chucks for receiving a vacuum force to adsorb and hold the second substrate.

14. A stage structure as claimed in claim 13, further comprising:
   a plurality of first fixing holes in a periphery of the upper stage for fixing bonded ones of the first and second substrates; and
   a plurality of second fixing holes in a periphery of the lower stage for fixing the bonded substrates.

15. A stage structure as claimed in claim 14, wherein the plurality of first fixing holes and the plurality of second fixing holes are formed at locations within the respective ones of the upper and lower stages different from each other.

16. A stage structure as claimed in claim 13, further comprising lift bar holes in the lower stage for one of supporting the second substrate during loading the substrate and lifting the second substrate from the lower stage during unloading.

17. A stage structure as claimed in claim 13, further comprising a plurality of second alignment mark confirming holes in a periphery of the lower stage for confirming marks for aligning the adsorbed second substrate.

18. A stage structure as claimed in claim 17, wherein the plurality of one of the first and second alignment mark confirming holes include at least two rough mark holes and at least four fine mark holes.

19. A stage structure as claimed in claim 17, wherein the second alignment mark confirming hole has a light provided therethrough.

20. A stage structure as claimed in claim 13, wherein the electro-static chucks includes at least six blocks, and each block includes at least four plate electrodes.

21. A stage structure as claimed in claim 1, further comprising:
   a first stage; and
   a second stage,
   wherein at least one of the first and second stages includes the plate.

22. A stage structure as claimed in claim 21, wherein the first stage is movably fitted in the bonding chamber.

* * * * *